United States Patent [19]

Schaeffer et al.

[11] Patent Number: 4,739,550

[45] Date of Patent: Apr. 26, 1988

[54] CONTACT ALIGNMENT TOOL

[75] Inventors: Richard L. Schaeffer, Carlisle; Robert Volinskie, Hershey; Robert L. Bendorf, Lemoyne, all of Pa.

[73] Assignee: AMP Incorporated, Harrisburg, Pa.

[21] Appl. No.: 887,665

[22] Filed: Jul. 17, 1986

[51] Int. Cl.[4] .................. H01R 43/20; B23P 19/00
[52] U.S. Cl. ........................... 29/741; 29/747; 29/750; 29/758; 29/759
[58] Field of Search .......... 29/876, 879, 884, 837, 29/759, 827, 758, 741, 747, 750

[56] References Cited

U.S. PATENT DOCUMENTS 4,328,613  5/1982  Kirkpatrick ..................... 29/837
4,611,399  9/1986  Tauwes et al. .................. 29/876

Primary Examiner—Timothy V. Eley
Attorney, Agent, or Firm—William B. Noll

[57] ABSTRACT

A tool for aligning contacts of an electrical connector with conductive areas of a circuit board comprises a clamp for clamping the connector therein, a slide is movably mounted on the clamp and includes a comb between the teeth of which the contacts are disposed, and adjustment means moves the slide and comb thereby causing the comb teeth to move the contacts so that they are positioned in alignment with the conductive areas.

14 Claims, 9 Drawing Sheets

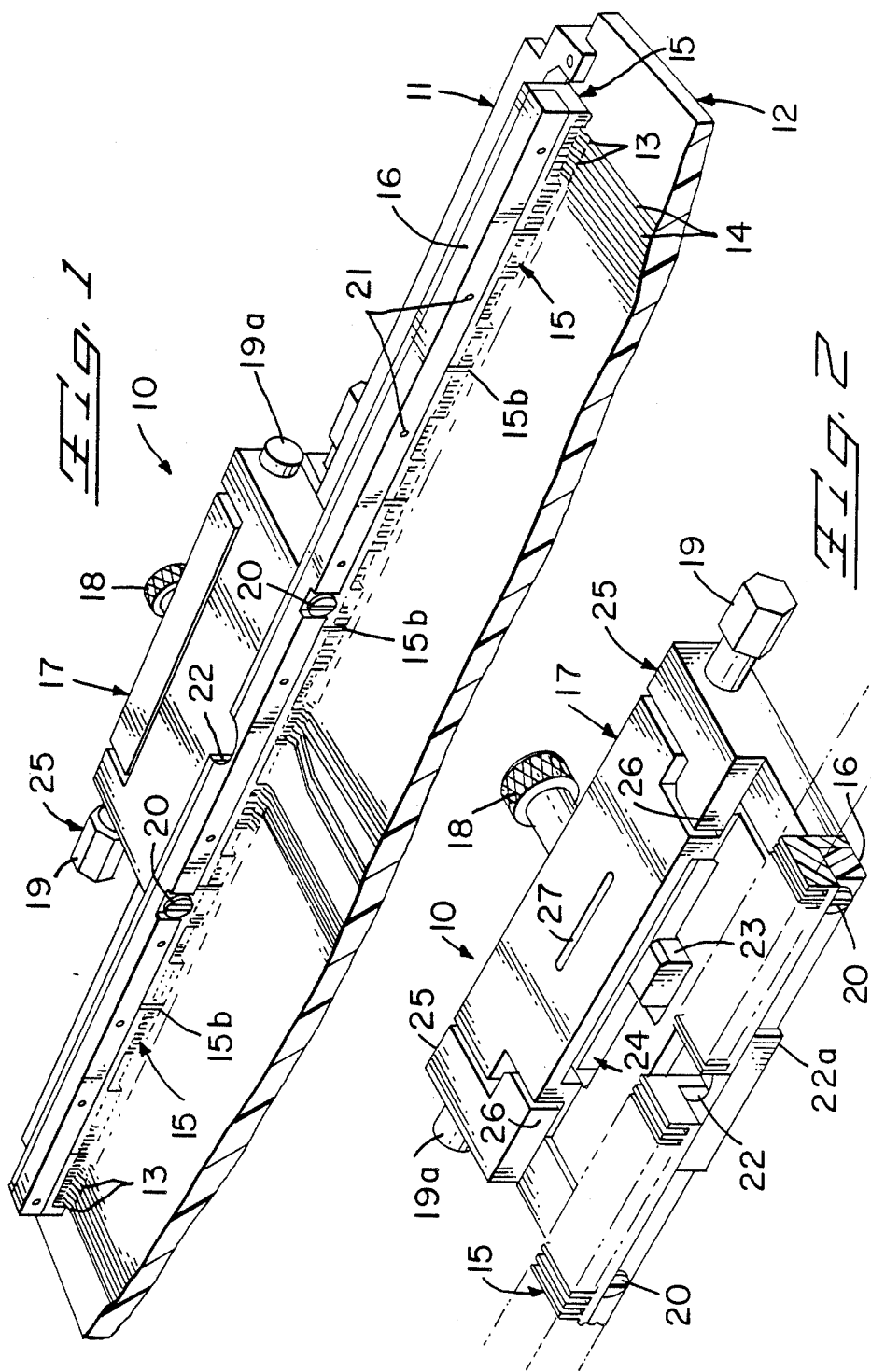

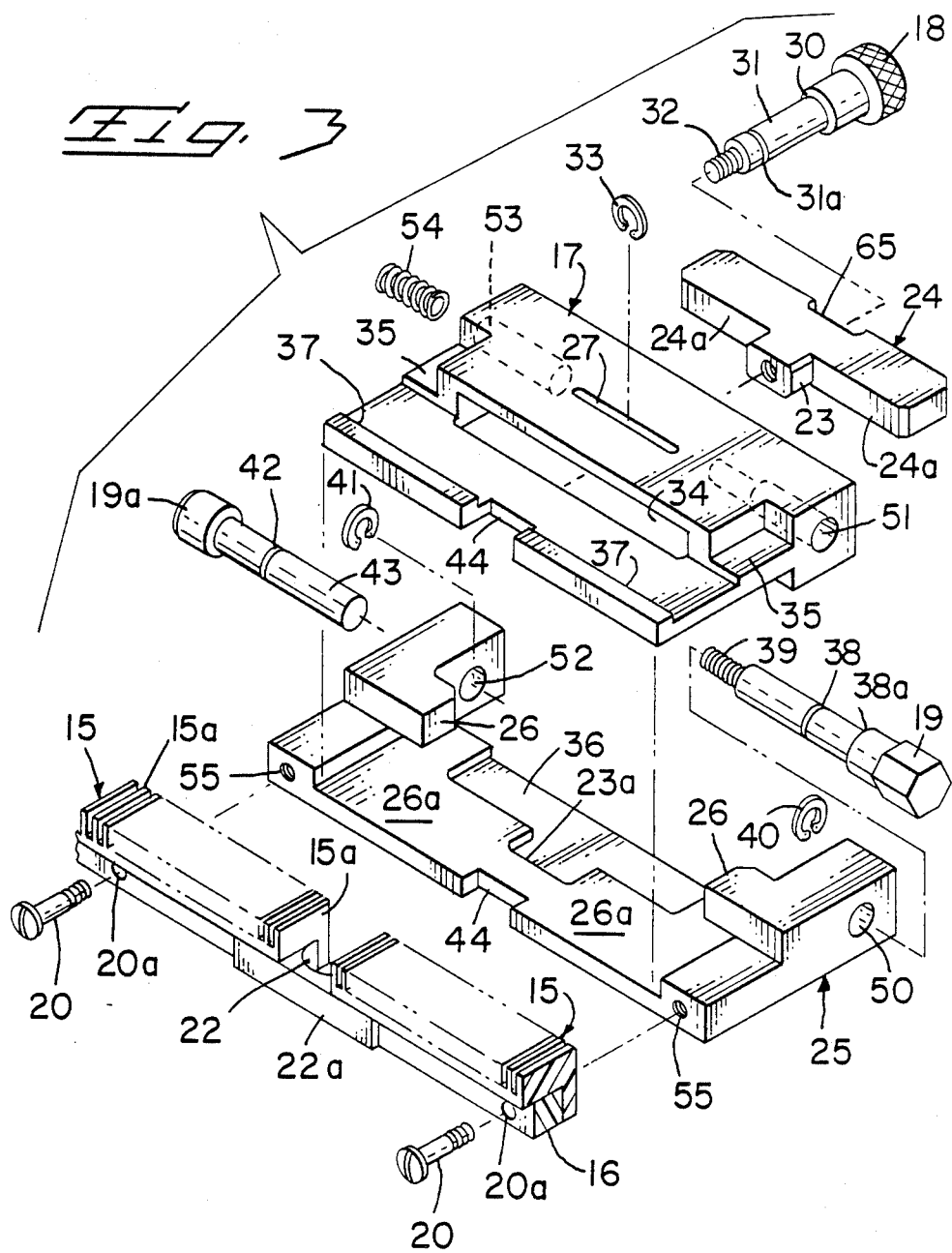

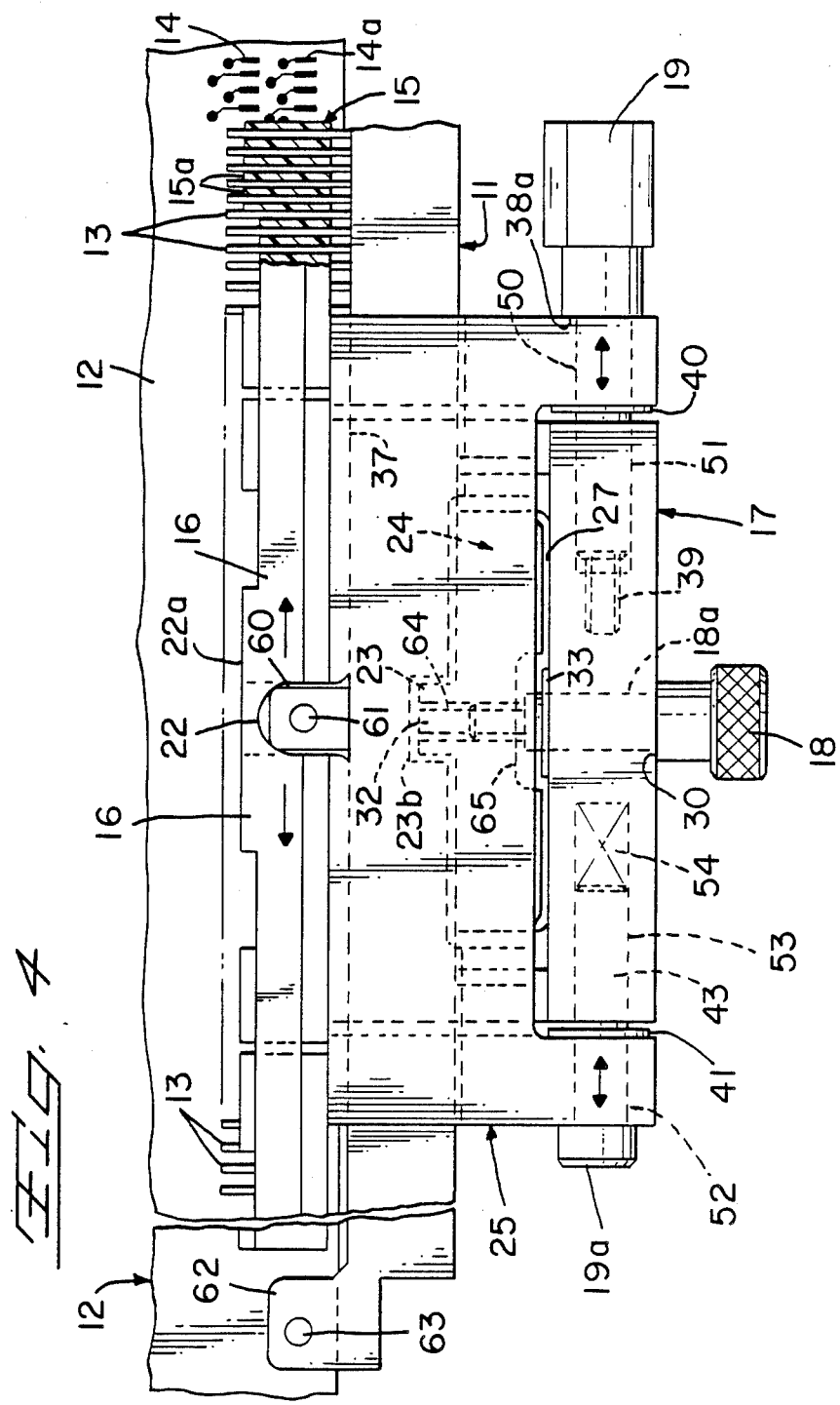

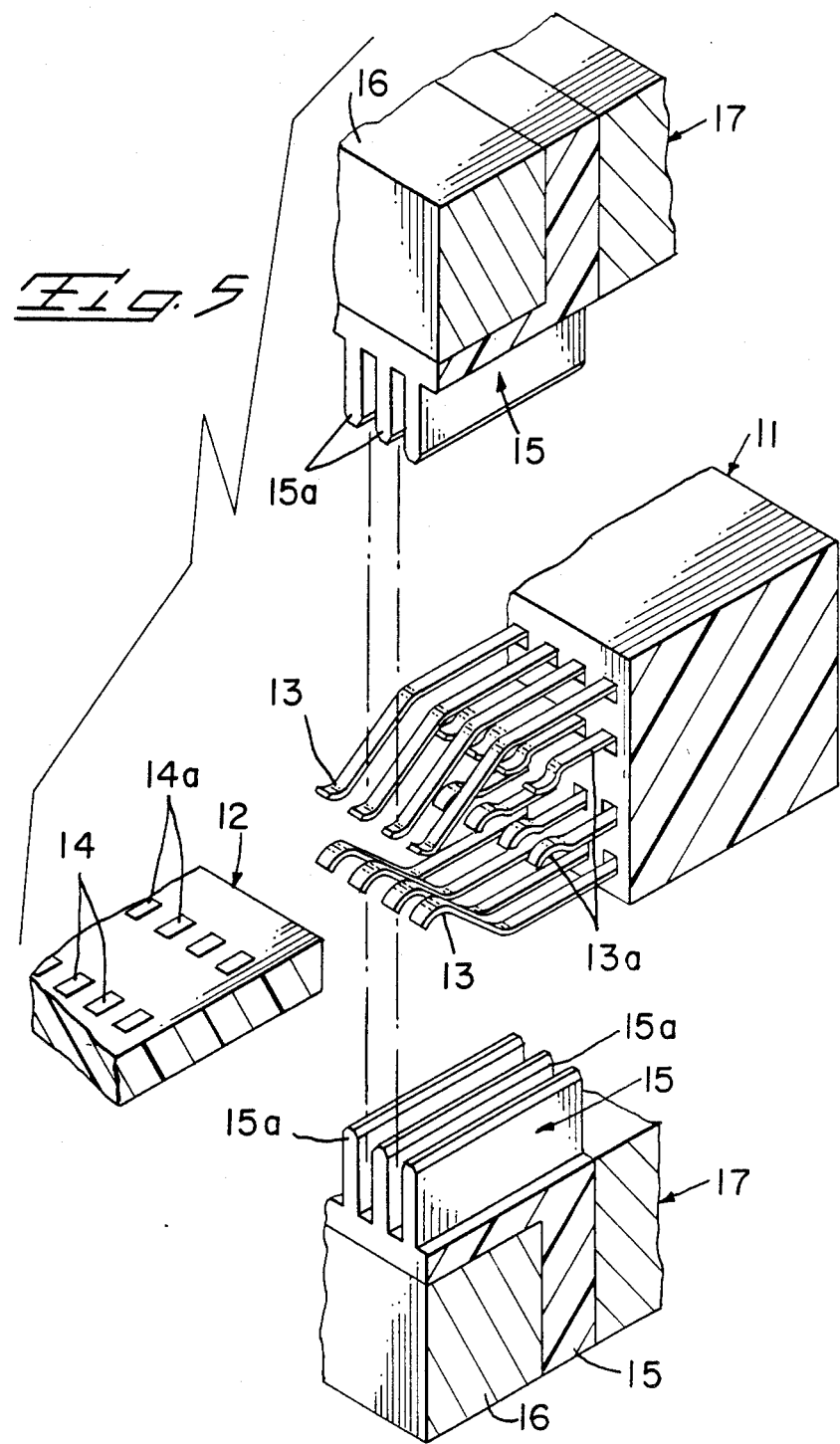

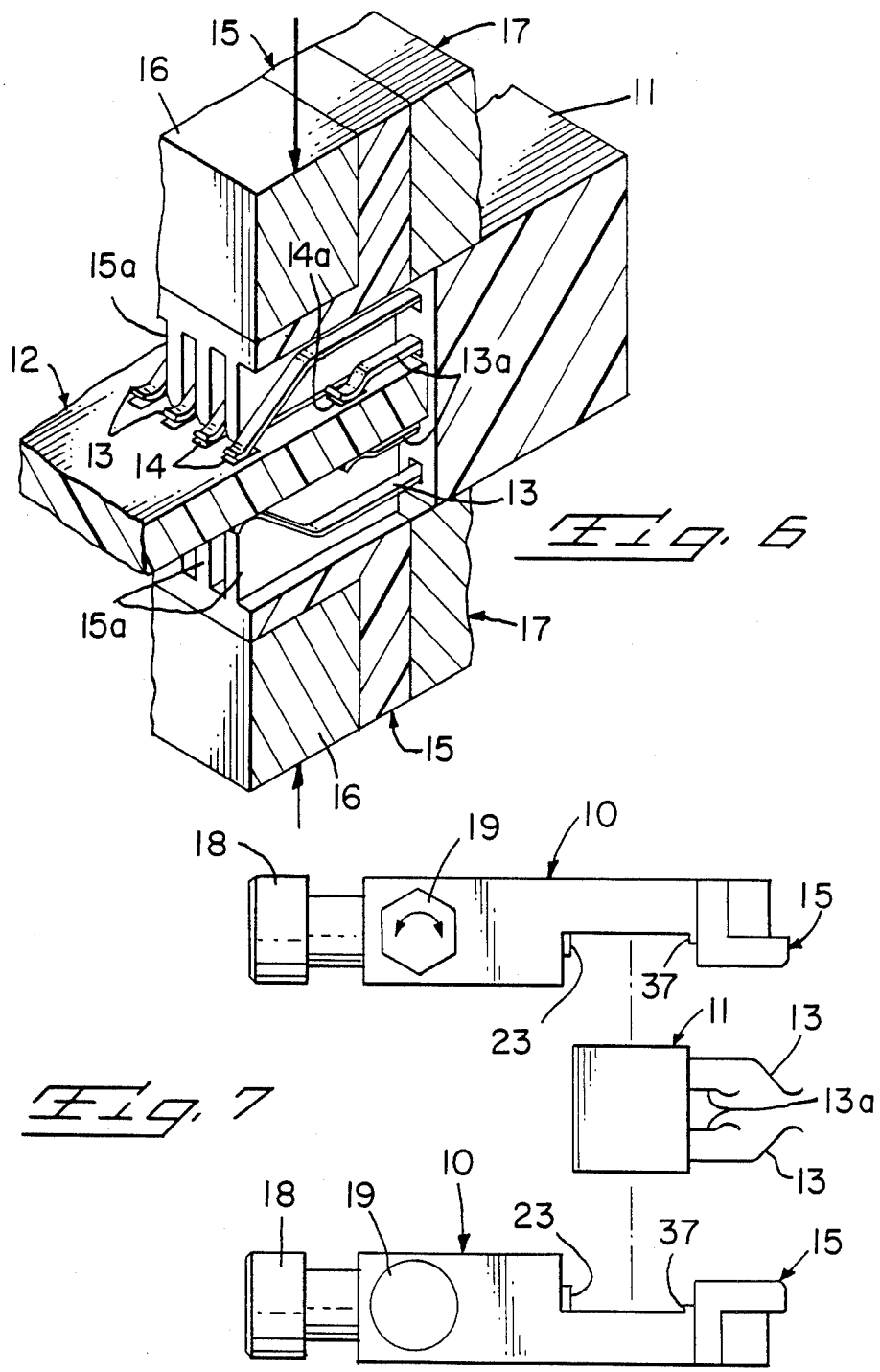

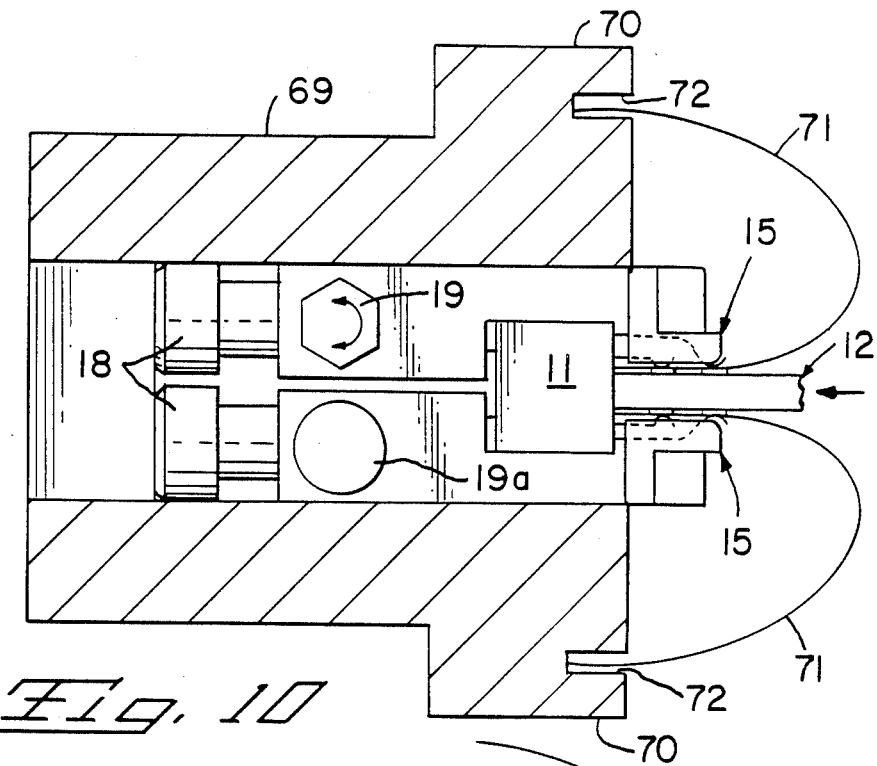
_Fig. 10_
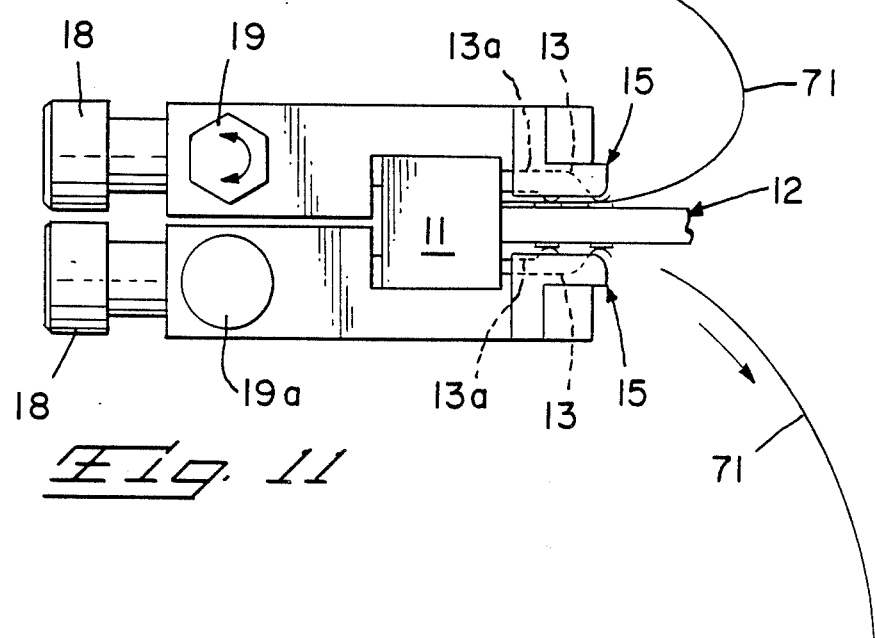
_Fig. 11_

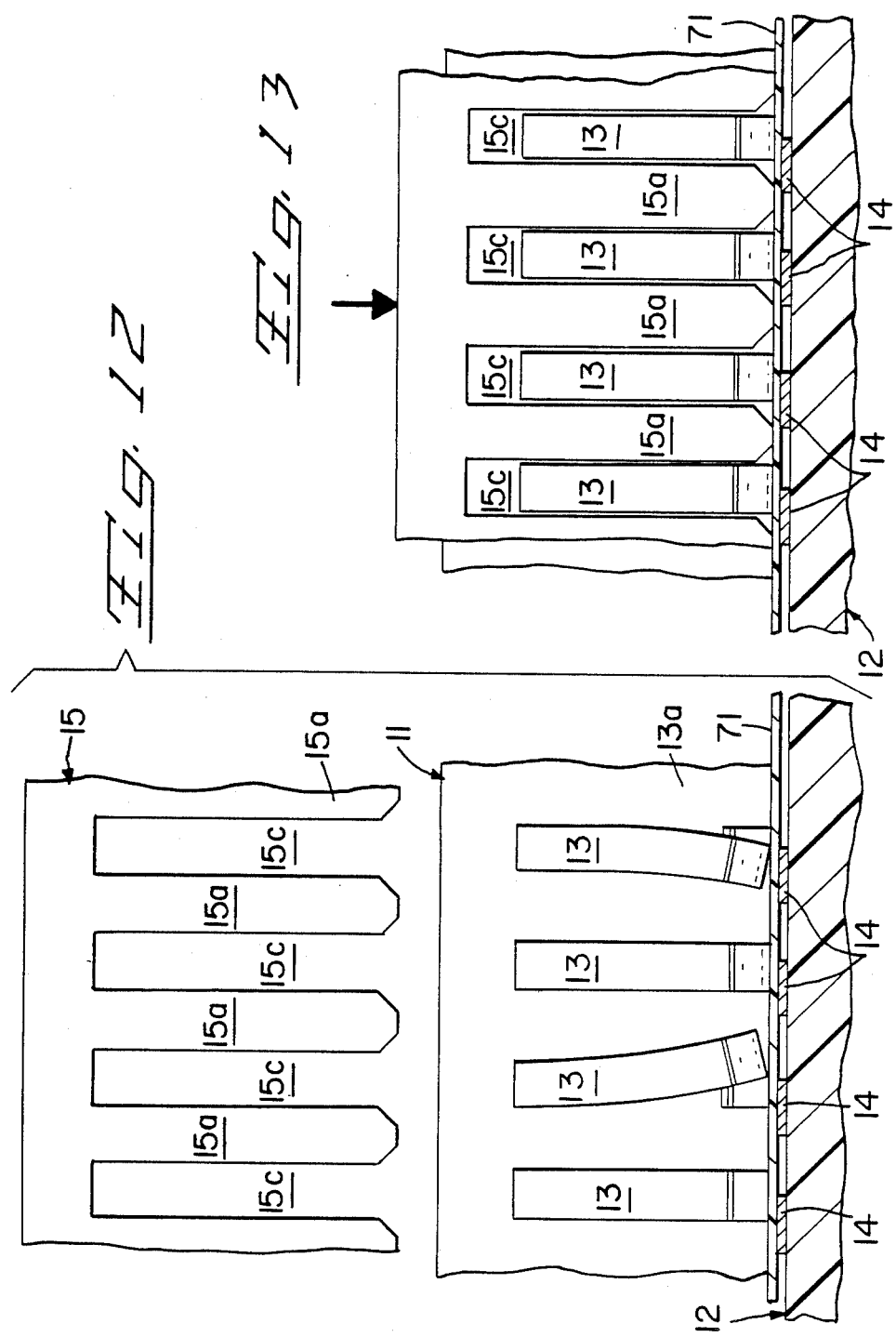

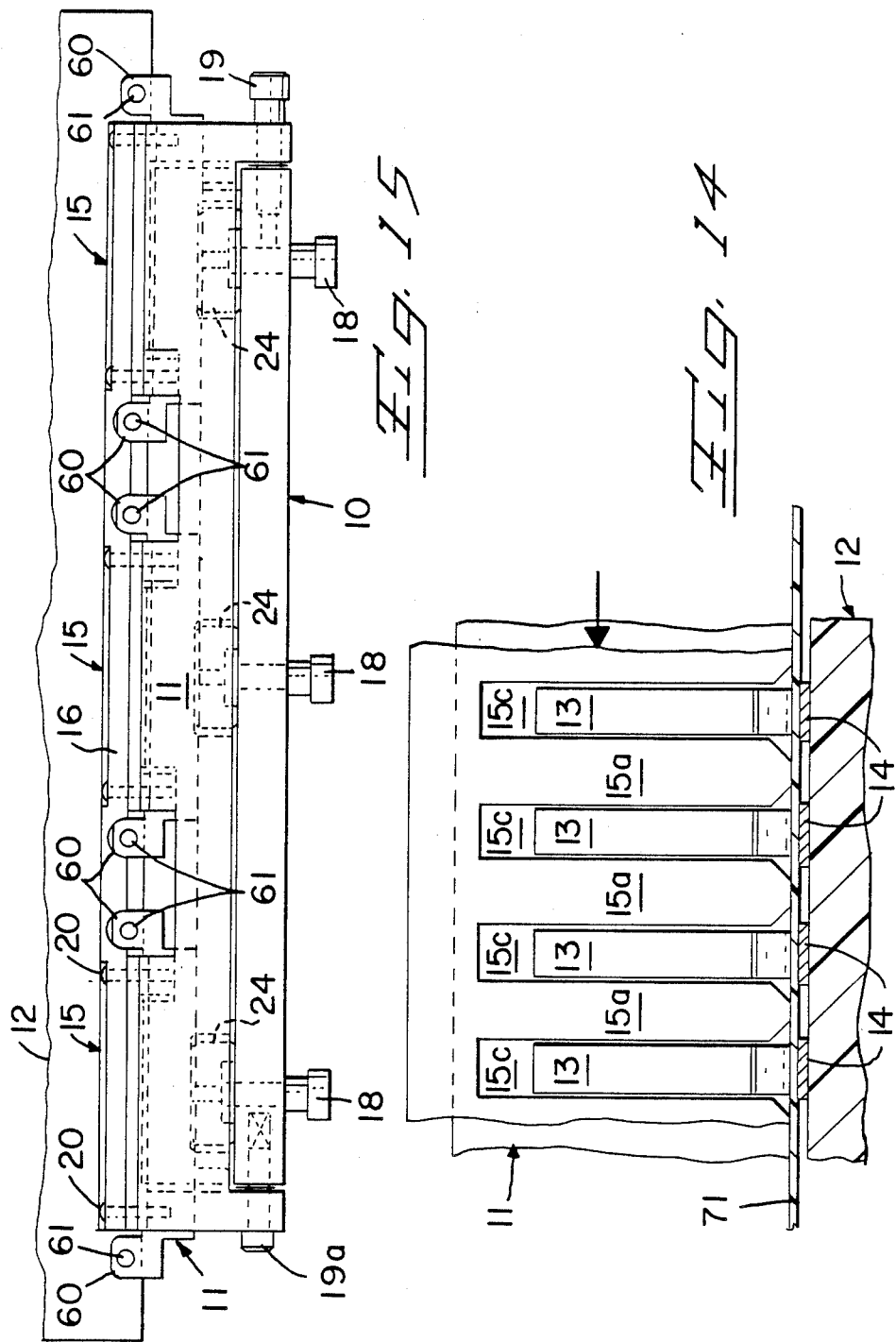

CONTACT ALIGNMENT TOOL

This invention relates to an alignment tool for proper placement of an electrical connector on an edge of a printed circuit board for establishing alignment of electrical contacts with leads or pads on the printed circuit board.

Further, this invention relates to a tool which properly aligns both inner and outer contacts of an electrical connector with printed leads or pads on a printed circuit board and wherein, after the alignment of the circuit board pads with the properly aligned contacts, these contacts are reflow soldered for surface mount application. Thus, the tool maintains a proper and accurate relationship with the contacts and the printed circuit board leads or pads so as to obtain highly reliable and trouble-free connections.

Still further, this invention relates to an alignment tool which may be used for both one-sided or two-sided connectors for a printed circuit board and may be used with a single connector or may be used with a series of connectors or with ganged connectors.

BRIEF DESCRIPTION OF THE BACKGROUND FOR THE INVENTION

As increasingly higher density connections are needed for circuit boards which have extremely high component packing density, the requirements for the connectors have become more and more severe and harder to meet. Especially after the circuit board has been completed with all of the components in place, the placement of the connector has become a critical feature in the method of circuit board fabrication.

The connector which must thereafter be connected has to have its electrical contacts connected to each of a number of circuit board leads or printed circuit pads. Thereafter, each pad is reflow soldered so as to assure great reliability for all the components on the boards and the board itself.

Because of the high packing density, the leads on a circuit board must be placed around the periphery thereof, and especially along one of the edges so that the component packing density may further be improved for the printed circuit board. These boards are used in an appropriate device such as a computer. The component packing density requires high connection density. Hence, connection density has fairly severe demands, such that problems have been encountered by the mere placement of the connector on an edge of a printed circuit board. For example, connectors have to be spaced at a spacing of about 0.050 inches center line to center line. These spacings have not been sufficient, and further density of these contacts has been obtained by placing two rows of contacts in line, one over the other, each making a connection to a different printed circuit board lead or pad; a contact lead width of less than 0.020 has been used for the above 0.050 center line to center line connectors.

Accordingly, the pads on the circuit board have been on the same 0.050 centerline as the connector contacts, and these very slim, reed-like contacts have had to be very carefully aligned so that these could he properly connected to the pads on the printed circuit board and thus readied for reflow soldering.

Various attempts have been made to assure contact integrity, but great difficulties have arisen by the mere mechanical placement of the connector contacts on the printed circuit boards. These rather fragile and easily distortable contacts have tended to be easily damaged, and although various aids have been used such as plastic insertion sheets to help avoid damage, the individual contacts have still been misplaced and/or have warped during reflow soldering. Further, there has been no satisfactory way of increasing the density of these contacts because of the high density connection requirements for modern circuit boards. While a number of attempts have been made to assure proper placement of the connector contacts after the placement of the connector has been achieved, the proper alignment has often been wanting and a number of reliability problems have appeared. These reliability problems are especially severe when one considers the loss associated by just one cotact not functioning and this one contact being the result of misalignment of just one of the connector contacts with the printed circuit board. Consequently, contact integrity and reliability are severe problems in the assembly of circuit boards for which a series of solutions have been offered, none of which has been satisfactory.

BRIEF DESCRIPTION OF THE PRESENT INVENTION

It has now been found that a number of problems encountered with the prior placement of the connector on an edge of a printed circuit board may be eliminated and/or minimized. Thus, surprising reliability has been achieved, heretofore unachievable with conventional means for placing high density in line connectors on a printed circuit board.

As a result of a newly invented tool, not only the placement of the connector on the printed circuit board has been considerably improved, but thereafter during the reflow soldering the great benefits obtained by the proper placement and alignment of the connector contacts with printed circuit board leads have been achieved, substantially without encountered disadvantages.

Still further, a novel method has been discovered which provides such easy insertion of the connectors on an edge of a printed circuit board as part of an overall solder reflow process that the reliability and reject rate can be minimized to such a substantial degree such that the loss associated with rejects has been substantially eliminated.

In addition, the novel tool which operates by gripping the connector, placing it properly on the printed circuit board and achieving the proper alignment thereon has had a number of features which causes it to be especially adaptable for two-sided high density in the connector applications. Still further, ganged connectors or a number of connectors independently placed may still be placed in conjunction with the present tool.

With the connector securely placed on the printed circuit board, thereafter all of the contacts and each individual contact may be properly aligned and properly positioned with repsect to the circuit pads on the printed circuit board.

This accurate placement, as a result of the utilization of the alignment tool has increased the reliability and contact integrity during solder reflow to such a degree that the results have been outstanding and significant in terms of the prior art devices and methods which heretofore have been employed. According to the present invention, a tool for aligning contacts of an electrical connector with conductive areas of a circuit board comprises a clamp for clamping the connector therein, a slide is movably mounted on the clamp and includes a comb between the teeth of which the contacts are disposed, and adjustment means moves the slide and comb thereby causing the comb teeth to move the contacts so that they are positioned in alignment with the conductive areas.

BRIEF DESCRIPTION OF THE DRAWINGS

In the drawings which are presented with this invention, various figures illustrate this invention and aspects thereof by way of example, and wherein:

FIG. 1 shows in an orthogonal view the alignment tool in combination with an electrical connector and a printed circuit board when the connector has been properly placed on a printed circuit board;

FIG. 2 illustrates in a part orthogonal view the alignment components of the tool, including the adjustable features of the tool;

FIG. 3 is an orthogonal assembly view of the alignment tool shown in FIG. 2, illustrating the component parts thereof;

FIG. 4 is an enlarged top view of the alignment tool shown in FIG. 1, including a connector as placed on a printed circuit board with part of the alignment features broken away to show printed pads on a circuit board;

FIG. 5 is a representative cross-sectional, part orthogonal view of a section of the connector and alignment tool prior to assembly, and the relationship of the tool and connector with the printed circuit board;

FIG. 6 is a cross-sectional, part orthogonal view of the assembly shown in FIG. 5 in an assembled position ready for reflow soldering of the connector contacts to the printed circuit board leads or pads;

FIG. 7 illustrates in a schematic, end-elevational view the assembly steps with two of the alignment tools for each side of a connector with contacts for connection to both sides of a printed circuit board;

FIG. 10 illustrates an end-elevational view of a fixture, a printed circuit board and a pair of alignment tools with the printed circuit board having been inserted in the connector;

FIG. 11 illustrates a completed positioning of a printed circuit board and a connector, but prior to the alignment of the connenctor contacts with the printed circuit board leads;

FIGS. 12 to 14 illustrate schematically in an enlarged part view the steps in the process for achieving alignment, and FIG. 15 illustrates a ganged connector and the use of the alignment tool for placing these connectors on a printed circuit board.

DETAILED DESCRIPTION OF THE INVENTION

Figure 8:
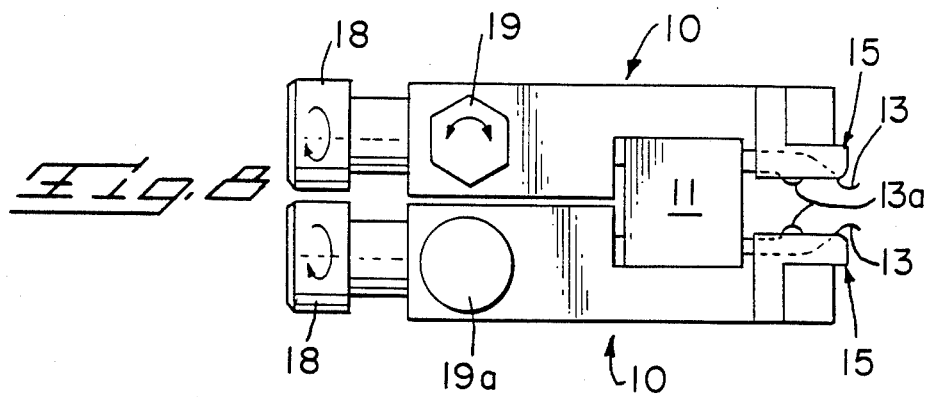
FIG. 8 illustrates an end-elevational view of the connector and a pair of alignment tools ready to be placed in a fixture suitable for joining the connector with a printed circuit board.

Turning now to FIG. 1, an alignment tool 10 is shown and an electrical connector 11 after placement on a printed circuit board 12. The alignment tool 10 is attached to the connector 11, ready for alignment of the individual electrical contacts 13 along the entire length of an edge of a printed circuit board.

Thus contacts 13 must each be carefully placed over the corresponding printed circuit board leads or pads 14. In FIG. 1, only the outer printed circuit board leads are shown. Inner leads or pads 14a are shown in FIG. 5 on board 12.

The alignment tool 10 has a comb 15 placed along a comb mounting bar 16. Individual sections of comb 15 have been designated by breakpoints 15b, and each of breakpoints 15b is of the same or approximate width as the spacing 15c (see FIG. 12) between each of comb teeth 15a, also shown in FIG. 5.

Each of the comb sections is secured to the comb mounting bar 16 by a dowel pin 21, and the entire comb mounting bar 16 is secured to the alignment tool by bolts 20.

The alignment tool 10, as it will be described further herein, has a sliding connector clamp 24 manipulated by a thumbscrew 18. A hexagonal head adjustment screw 19 moves adjustment slide 25 back and forth on the clamp plate 17 as guided by guide pin 19a with adjustment screw 19 also acting as a guide pin, thus allowing contacts 13 to be precisely and assuredly aligned with printed circuit board leads or pads 14.

With reference to FIG. 2, contact alignment tool 10 has been shown in greater detail in this figure without a connector 11 being secured to the tool. In comparison with FIG. 1, FIG. 2 shows the contact alignment tool in an inverted position from that shown in FIG. 1. After the connector has been secured to tool 10, an identical tool is placed face to face with the tool illustrated in FIG. 1 and then the connector placed on the printed circuit board as shown in FIG. 1 thereby accurately aligning contacts 13 with respective leads or pads 14 on both sides of board 12.

FIG. 2, however, is also best understood in combination with the orthogonal assembly drawing shown in FIG. 3. Thus, clamp plate 17 carries within it connector clamp 24. Connector clamp 24 has a connector engagement tooth 23 which engages connector 11 in a corresponding notch 23b in connector 11 as best shown in FIG. 4. A milled out section 34 in clamp plate 17 accommodates connector clamp 24. A corresponding milled out section 36 in adjustment slide 25 likewise accommodates connector clamp 24. Thus when connector clamp 24, as activated by thumbscrew 18, engages connector 11 as shown in FIGS. 1 and 4, thumbscrew 18 urges connector clamp 24 forwardly and secures connector 11 between connector clamp surface 24a and raised rib 37 on clamp plate 17.

At the same time, connector clamp 24 has secured by means of connector tooth 23 the connector in an appropriate notch 23b provided on connector 11 as shown in FIG. 4.

Returning now to FIG. 3, clamp plate 17 moves underneath detents 26 of adjustment slide 25. Detents 26 cooperate with notched-out sections 35 on clamp plate 17 and hold clamp plate 17 on surface 26a of adjustment slide 25 as shown in FIG. 3. Notches 44 on clamp plate 17 and adjustment slide 25 are to accommodate lug 60 of connector shown in FIG. 4, which has an aperture 61 in it for placing a bolt or a like device through it and through circuit board 12. As aperture 61 defines a reference point on the circuit board for connector 11, circuit board 12 readily accepts securing of connector 11 at an appropriate location for balancing thermal expansion for connector 11 and tool 10 when placed on circuit board 12. More than one lug 60 may be provided on a connector 11, but these are best used after only one has been secured and solder reflow accomplished. For ganged connectors it may be necessary to fasten more than one lug 60 to board 12.

Connector clamp 24, as previously mentioned, is in milled out section 34 of clamp plate 17 and is urged forwardly and rearwardly by thumbscrew 18. As shown in FIG. 3, thumbscrew 18 has a threaded section 32 which threadably mates with threaded hole 64 in clamp 24 as shown in FIG. 4. Thumbscrew 18 has a shoulder 30 which rides against against clamp plate 17. In turn, thumbscrew 18 is confined within an aperture 18a in clamp plate 17 and between shoulder 30 by snap C-ring 33 which fits into groove 31a of section 31 of thumbscrew 18. Snap C-ring 33 is placed in groove 31a through slot 27 in clamp plate 17. A recess 65 in connector clamp 24 provides sufficient space for the thumb screw section 31 to accommodate groove 31.

Further, adjustment slide 25 is movably secured to clamp plate 17 by hexagonal head adjustment screw 19 and its corresponding guide pin 19a. Thus hexagonal head adjustment screw 19 is inserted in aperture 50 in adjustment slide 25 and a corresponding aperture 51 in clamp plate 17. Likewise, guide pin 19a is disposed in aperture 52 in adjustment slide 25 and corresponding aperture 53 in clamp plate 17. However, in order to restrain in a positive manner clamp plate 17 so that it does not have free play in adjustment slide 25, a spring 54 is placed in aperture 53. Spring 54 is restrained by portion 43 of guide pin 19a which also includes groove 42 for receiving snap C-ring 41 thereby securing pin 19a on slide 25 so that spring 54 via guide pin 19a at all times positively urges clamp plate 17 toward the right when viewing FIG. 4.

Adjustment screw 19 has likewise a threaded portion 39 which threadably mates with a threaded section of aperture 51 in clamp plate 17. Snap C-ring 40 is received in groove 38 in adjustment screw 19 thereby securing screw 19 on slide 25. Shoulder 38a of adjustment screw 19 engages the outside surface surrounding the aperture 50 on adjustment slide 25.

As previously discussed, comb mounting bar 16 is secured to adjustment slide 25 by means of bolts 20 which fit through corresponding apertures 20a in mounting bar 16 and comb 15 and mate with threaded holes 55 in adjustment slide 25.

In order to accommodate connector 11 to lugs 60 as shown in FIG. 4, mounting bar 16 has notched out section 22 which corresponds to the notch 44 in adjustment slide 25. Because of this weakened section in comb mounting bar 16, mounting bar 16 has enlarged section 22a.

FIG. 4 shows in a top view the contact alignment tool shown orthogonally in FIG. 1 and illustrates securing of connector 11 to printed circuit board 12 via lugs 60,62 with bolts (not shown) extending through holes 61,63.

As previously discussed in connection with FIG. 3, adjustment slide 25 with its comb 15 moves relative to connector 11 which is secured between connector clamp 24 and clamp plate 17 via thumbscrew 18. Thus, adjustment slide 25 is the means by which comb mounting bar 16 is moved relative to connector 11. Moreover, in the partly broken away comb section 15 in FIG. 4, outer pads 14 and inner pads 14a have been shown on circuit board 12.

In an assembly cross-section for combs 15, circuit board 12 and connector 11 in FIG. 5, connector 11 has been illustrated, showing in-line outer contacts 13 and inner contacts 13a. These contacts must be carefully aligned with printed circuit board pads 14 and 14a shown on printed circuit board 12. In FIG. 5, the comb mounting bar 16, a section of comb 15, including adjustment slide 17, have also been shown. Combs 15 have comb teeth 15a with an appropriate spacing between a pair of comb teeth 15a to accommodate the inner and outer aligned contacts 13a and 13, respectively, along each side of connector 11.

When the connector 11 has been properly secured to circuit board 12, the orthogonally depicted cross-sectional view in FIG. 6 shows connector 11 in a clamped position with the combs 15 subject to the adjustment features and the benefits gained therefrom, as will be further discussed herein with reference to FIGS. 7 to 14 which illustrate the process sequence as well as the steps needed to manipulate the connector 11 and the contact alignment tools 10.

Thus, FIG. 7 shows two contact alignment tools 10 in a schematic end elevational view prior to being secured to connector 11.

FIG. 8 illustrates the two alignment tools properly secured to connector 11, with inner and outer contacts 13a and 13 being appropriately shown in place and disposed between teeth 15a of combs 15.

Figure 9:
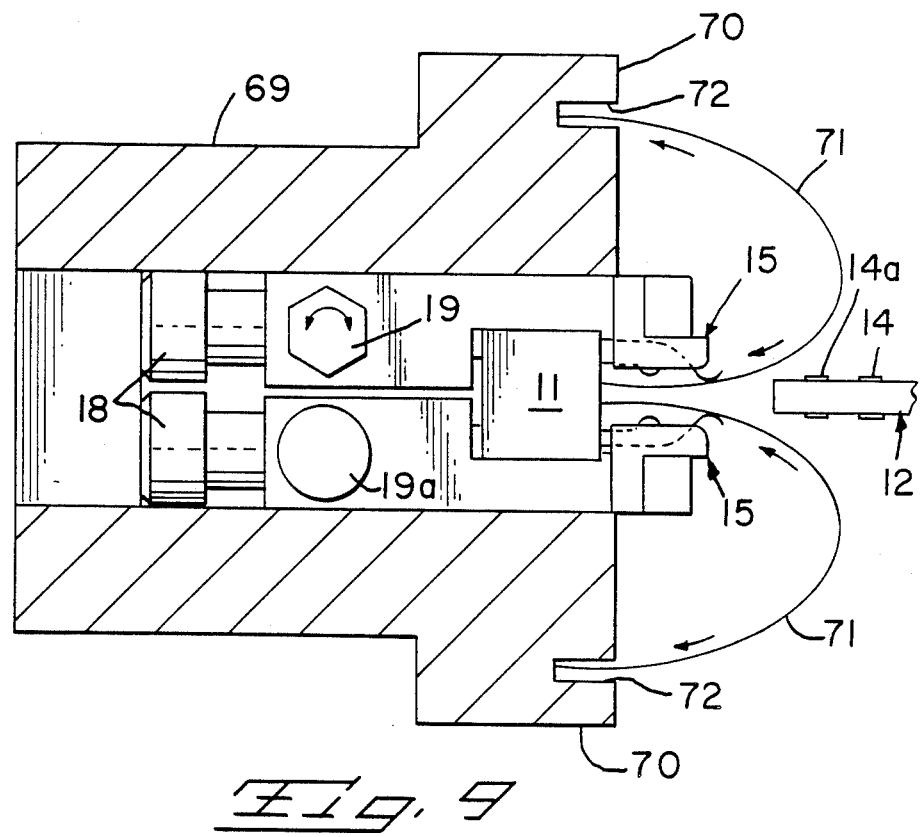
FIG. 9 illustrates an end-elevational view of a fixture for joining with a printed circuit board a connector held by a pair of alignment tools.

FIG. 9 illustrates a fixture 69 which is used for the insertion of connector 11 onto printed circuit board 12 with printed circuit lead pads 14a and 14 being shown for the inner and outer printed circuit leads or pads, respectively.

In order to facilitate insertion of printed circuit board 12 between contacts 13,13a without damaging them, fixture 69 is used to receive in notches 72 ends of thin transparent plastic sheets 71 which are then inserted between contacts 13 and 13a on both sides of connector 11. This arrangement facilitates the insertion of printed circuit board 12 between contacts 13,13a as shown in FIG. 10 and places in a proper position the connector on circuit board 12 vis-a-vis its reference holes and the like.

In FIG. 11, fixture 69 is removed but sheets 71 remain in place between contacts 13,13a and board 12. The actual alignment of the connector contacts 13 and 13a, by means of adjustment screws 19 takes place prior to the removal of sheets 71. The adjustment is much more readily accomplished with sheets 71 in place because contacts 13,13a can easily be moved along sheets 71 rather than board 12 or pads 14,14a. As sheets 71 are transparent, the actual movement of contacts 13,13a and the relationship thereof relative to pads 14 or 14a so as to place contacts 13,13a accurately thereon can be readily observed.

After the completion of the contact alignment on one side of board 12, printed circuit board 12 is turned over and the same steps are repeated with the other side of the circuit board 12.

FIG. 12 is an appropriate illustration of the various positions of the circuit board pads 14 vis-a-vis the outer contacts 13 and inner contacts 13a for connector 11. Without the comb 15 and the comb teeth 15a and the comb spacing 15b to help, various misalignments are fairly evident. Even when sheets 71 are being used to accomplish insertion, without the tool between the contacts 13 and pads 14, the alignment is not sufficient. When tool 10 is secured to connector 11, comb teeth 15a will place contacts 13,13a on their proper centerlines as shown in FIG. 13.

Prior to alignment tool 10 being employed, FIG. 13 shows the misalignment. The alignment achieved with contact alignment tool 10 is clearly evident, as further shown in FIG. 14 where alignment has been accomplished vis-a-vis contacts 13 and circuit board solder pads 14. As each of the connector contacts has a relative side play at the junction of contacts 13 with the connector 11 housing, the alignment can thus be readily fulfilled and made with great assurance with the individual contacts, e.g., 13 and 13a, being properly and squarely placed on the circuit board pads 14 and 14a for the circuit board 12. After the above has been accomplished, sheets 71 shown in FIG. 14 are removed. At the bottom, comb teeth 15a have beveled edges to accommodate any solder during solder reflow.

Further, as shown in FIG. 15, a number of connectors 11 may be used on an edge of printed circuit board 12 with one tool. Thus, in this Figure, three connectors 11 are shown. Each is secured by connector clamp 24 and the corresponding connector clamp thumbscrew 18.

The apertures along the edge of the board in alignment with apertures 61 in lugs 60 are conventionally called reference point apertures. Therefore, a single comb mounting bar 16 may be used with appropriate combs 15 mounted thereon for the entire length of mounting bar 16. Screws 20, as described above, secure the mounting bar to alignment tool 10.

The adjustment is in the same manner as previously discussed, i.e., the entire adjustment of the contacts of all three connectors 11 is accomplished by means of hexagonal head adjustment screw 19 as guided by guide pin 19a and adjustment screw 19.

Moreover, for a connector of considerable length to be mounted along one edge of printed board 12, connector 11 may have one lug 60 with an aperture 61 therein secured to the board via a bolt; then the solder reflow is performed, and then connector 11 is completely secured to board 12 by placing appropriate bolts and the like in apertures 61 in lugs 60 and respective holes in board 12.

As readily discerned from the above description, the invention herein allows a proper placement of high density in-line contacts of electrical connectors, either individually or in a ganged relationship on an edge of a printed circuit board. Such placement of the connectors is readily accomplished and the necessary adjustments made before solder reflow. During solder reflow the tool is in place and maintains the contacts in a precise position relative to the solder pads to which the contacts are to be soldered. It is important that the comb mounting bar and the printed circuit board have nearly identical thermal coefficients of expansion.

High contact connection integrity is thus assured. Hence, reliability of printed circuit boards is considerably improved. The reject rate for these boards is substantially reduced, if not eliminated by use of the present invention.

As mentioned before, the presently disclosed tool may also be used for high density single line contact connectors, that is, not in-line connectors, but with a single row of contacts where the connector leads are either on one or both sides of the printed circuit board.

Although further variations of the invention may be envisioned, such as where more than two leads are in a line, that is, three and more, the present tool lends itself to the use of connectors with any contact lead arrangements. Nevertheless, it must be emphasized that with increased in-line contacts and their density, problems arise which are necessarily more severe than when only two contacts are in line.

In addition to the description concerning the tool and the manner in which it is being used for applying a connector on a printed circuit board, it must be appreciated that the method of securing these connectors to the printed circuit board is a novel method in terms of the accomplishment of the adjustments and alignment. Consequently, all aspects of the disclosed invention are to be considered as part of this invention, and the scope of this invention is to be defined by the appended claims.

What is claimed is:

1. A tool for aligning contacts of an electrical connector, comprising:
    a plurality of comb sections;
    a mounting bar for said plurality of comb sections;
    adjustment slide means, said mounting bar interconnected with said adjustment slide means;
    clamp means for the connector;
    a clamp plate for said clamp means;
    means for adjustment of said adjustment slide along said clamp plate.

2. A connector contact alignment tool comprising:
    a plurality of comb sections;
    mounting means for said plurality of comb sections;
    adjustment slide means, said adjustment slide means and said mounting means integrally interconnected with each other;
    clamp means for the connector;
    a clamp plate, said clamp means interconnected with said clamp plate for securing the connector to said clamp plate, and
    means for adjustment of said adjustment slide means, including said comb mounting means movable with respect to said clamp plate means.

3. The tool as defined in claim 2, wherein said clamp plate includes rib means for securing of the connector to said clamp plate.

4. The tool as defined in claim 2, wherein said clamp plate includes a cut out section for securing of the connector to said clamp means.

5. The tool as defined in claim 2, wherein said clamp means includes a clamp tooth.

6. The tool as defined in claim 2, wherein said clamp plate includes means for accommodating securing means for the connector.

7. The tool as defined in claim 2, wherein said adjustment slide means includes detent means for said clamp plate.

8. The tool as defined in claim 2, wherein said adjustment slide means are adjustably and guidingly interconnected with said clamp plate means.

9. The tool as defined in claim 2, wherein said means for adjustment of said adjustment slide means includes guide means, spring means cooperating with said guide means and said clamp plate means, a threaded bolt for adjustment of said adjustment slide, including detent means on said bolt and on said guide means.

10. A tool for aligning contacts of an electrical connector with conductive areas of a circuit board, comprising:
    clamp means for clamping the electrical connector therein;
    slide means having comb means, said comb means having teeth means between which are contact receiving positions;
    means mounting said slide means onto said clamp means including adjustment means for moving said slide means and said comb means relative to said clamp means thereby positioning the contact receiving positions in alignment with the conductive means on the circuit board.

11. A tool as claimed in claim 10, wherein said clamp means includes a clamping surface against which one surface of the connector engages and a movable clamping member for clampingly engaging a second surface of the connector, and operating means for moving said movable clamping member.

12. A tool as claimed in claim 10, wherein said mounting means includes pin means between said slide means and said clamp means and adjustment screw means between said slide means and said clamp means.

13. A tool as claimed in claim 10, wherein spring means is disposed between said pin means and said clamp means.

14. An apparatus for aligning contacts of an electrical connector with conductive areas of a circuit board, comprising:
a tool having clamp means for clamping the connector therein;
slide means movable mounted on the clamp means and including comb means having teeth means between which are contact receiving positions;
fixture means in which said tool is to be disposed;
plastic sheet means extending between said fixture means and along said contact receiving positions and acting as guide means for guiding the end of the circuit board between the plastic sheet means;
adjustment means for moving said slide means and said comb means and adapted for moving contacts to positions in alignment with the conductive areas.

* * * * *